(12) United States Patent
Hooper et al.

(10) Patent No.: US 10,373,857 B2
(45) Date of Patent: Aug. 6, 2019

(54) BACKSIDE STEALTH DICING THROUGH TAPE FOLLOWED BY FRONT SIDE LASER ABLATION DICING PROCESS

(71) Applicant: Micron Technology, Inc., Boise, ID (US)

(72) Inventors: Andy E. Hooper, Hillsboro, OR (US); Nicholas Wade Clyde, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/017,567

(22) Filed: Jun. 25, 2018

(65) Prior Publication Data

US 2019/0131160 A1 May 2, 2019

Related U.S. Application Data

(63) Continuation of application No. 15/797,029, filed on Oct. 30, 2017, now Pat. No. 10,079,169.

(51) Int. Cl.
| | |
|---|---|
| *H01L 21/683* | (2006.01) |
| *H01L 21/02* | (2006.01) |
| *B23K 26/364* | (2014.01) |
| *H01L 21/67* | (2006.01) |
| *H01L 21/78* | (2006.01) |
| *H01L 21/268* | (2006.01) |
| *B23K 101/40* | (2006.01) |

(52) U.S. Cl.
CPC ........ *H01L 21/6836* (2013.01); *B23K 26/364* (2015.10); *H01L 21/02057* (2013.01); *H01L 21/268* (2013.01); *H01L 21/67092* (2013.01); *H01L 21/78* (2013.01); *B23K 2101/40* (2018.08); *H01L 2221/68336* (2013.01)

(58) Field of Classification Search
CPC ................. H01L 21/6836; H01L 21/78; H01L 2221/68336
See application file for complete search history.

(56) References Cited

U.S. PATENT DOCUMENTS

| | | | |
|---|---|---|---|
| 9,165,832 B1 | 10/2015 | Papanu et al. | |
| 2012/0322233 A1 | 12/2012 | Lei et al. | |
| 2015/0348821 A1 | 12/2015 | Iwanaga et al. | |

OTHER PUBLICATIONS

US Patent and Trademark Office; Office Action for U.S. Appl. No. 15/797,029 dated Jun. 15, 2018.

*Primary Examiner* — Selim U Ahmed
*Assistant Examiner* — Evan G Clinton
(74) *Attorney, Agent, or Firm* — Parsons Behle & Latimer

(57) ABSTRACT

A method of forming a plurality of semiconductor devices includes applying a tape material to a back side of a semiconductor device having a silicon layer on the back side and a circuitry layer on the front side, lasing with an infrared laser the silicon layer through the tape material, lasing with a second laser the circuitry layer, and expanding the tape material for form a plurality of semiconductor devices. The second layer may be an ultraviolet laser. The lasers may be irradiated in a pattern on the bottom side and the top side. The second layer may form a groove in the circuitry layer that does not penetrate the silicon layer. The infrared laser may cleave a portion of the silicon lattice of the silicon layer. A coating may be applied to the circuitry layer prior to being irradiated with the second laser.

3 Claims, 5 Drawing Sheets

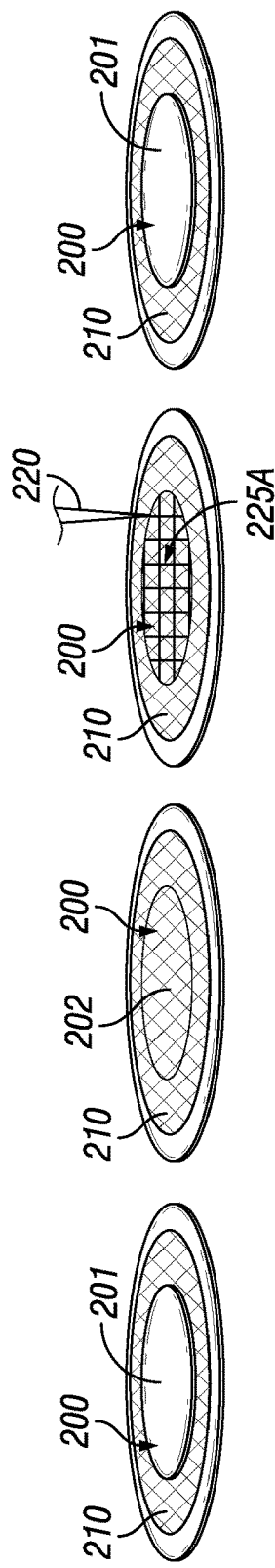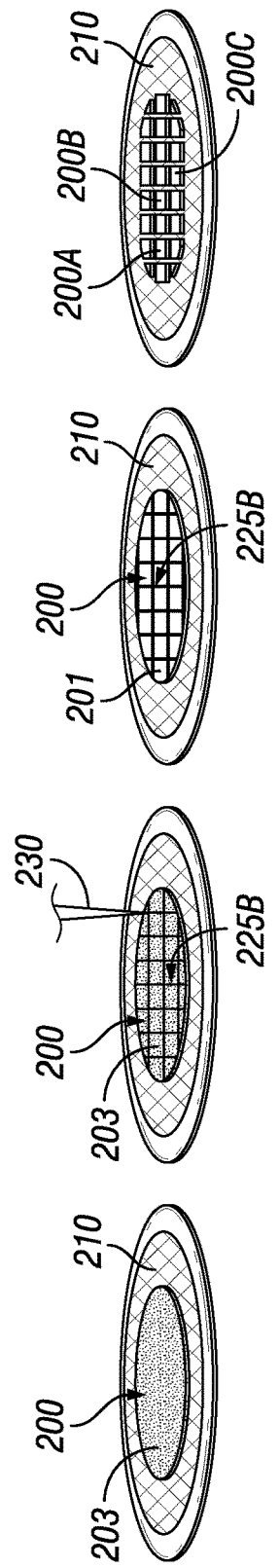

BACKSIDE STEALTH DICING THROUGH TAPE FOLLOWED BY FRONT SIDE LASER ABLATION DICING PROCESS

RELATED APPLICATIONS

The present disclosure is a continuation patent application of U.S. patent application Ser. No. 15/797,029, entitled Backside Stealth Dicing Through Tape Followed by Front Side Laser Ablation Dicing Process filed on Oct. 30, 2017, which is incorporated by reference herein in its entirety.

FIELD

The embodiments described herein relate to methods of forming semiconductor devices.

BACKGROUND

A semiconductor device may include a plurality of semiconductor devices formed on a single substrate. For example, a semiconductor wafer may include a plurality of dies that may be processed to form a plurality of dies from a single semiconductor wafer. Various processes may be used to separate the semiconductor device into a plurality of semiconductor devices.

Stealth dicing through tape is one process that may be used to separate the semiconductor wafer into a plurality of semiconductor devices. The semiconductor device typically may comprise a circuitry layer positioned on a silicon layer. The circuitry layer comprising the top surface and the silicon layer comprising the bottom surface. The back side or bottom surface of the semiconductor wafer is applied to a tape material. Various tape materials may be used such as Lintec D-L01wtest38 tape.

A laser tool is then used to irradiate an infrared laser through the tape on the back side of the wafer. A focal point of the infrared laser is positioned substantially with a middle portion of the silicon layer of the semiconductor wafer. The infrared laser cleaves a portion of the silicon lattice of the silicon layer. The infrared laser is irradiated in a pattern along the back side of the semiconductor wafer. The pattern is typically a grid pattern that divides the semiconductor wafer into individual dies. The infrared laser does not penetrate the circuitry layer of the semiconductor wafer and the semiconductor wafer is still intact after the lasing processes with portions of the silicon lattice being cleaved in a pattern along the interfaces between the individual dies. A tape expander machine is then used to apply an expanding force to the tape attached to the back of the semiconductor wafer. The expansion of the tape causes the silicon lattice to break apart where it has been cleaved by the infrared laser. The separation of the silicon layer also causes the circuitry layer to break apart along the same pattern to separate the semiconductor wafer into a plurality of individual dies.

The stealth dicing through tape process works well to separate a semiconductor wafer into individual dies when a thickness of the silicon layer is much larger than a thickness of the circuitry layer. For example, the silicon layer may be 55 microns thick and the circuitry layer may be 6 microns thick. However, as the ratio of the thickness of the silicon layer to the circuitry layer decreases the circuitry layer may not be cleanly separated by the expansion of the tape material. For example, the stealth dicing through tape process does not cleanly separate the metal layer into individual dies with the thickness of the silicon layer is 22 microns and the thickness of the circuitry layer is 6 microns.

Additional drawbacks and disadvantages may exist.

BRIEF DESCRIPTION OF THE DRAWINGS

FIGS. 2A-2H are schematics showing one method of processing a semiconductor wafer to form a plurality of semiconductor devices.

Figure 1:
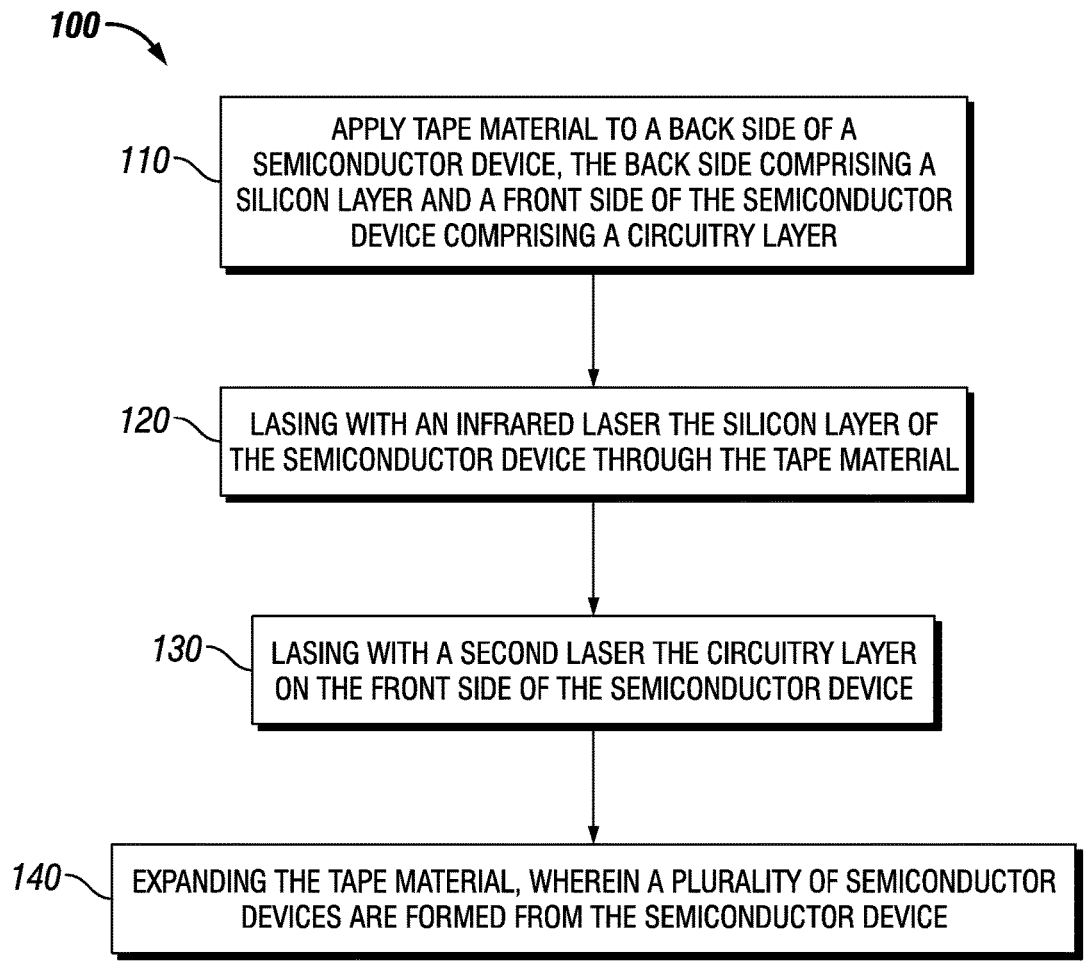
FIG. 1 is a flow chart of one embodiment of a method of forming a plurality of semiconductor devices.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor wafer, but semiconductor devices are not limited to semiconductor wafers.

As used herein, the terms "vertical," "lateral," "upper," and "lower" can refer to relative directions or positions of features in the semiconductor devices shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed methods of making semiconductor devices. One embodiment of the disclosure is a method comprising applying a tape material to a back side of a semiconductor device. The semiconductor device comprises a silicon layer on the back side and a circuitry layer on the front side. The method comprises lasing with an infrared laser the silicon layer through the tape material, lasing with a second laser the circuitry layer, and expanding the tape material for form a plurality of semiconductor devices.

One embodiment of the disclosure is a method comprising cleaving at least a portion of a silicon lattice of a silicon layer of a semiconductor device by applying in a pattern a first laser and cutting a groove in a circuitry layer of the semiconductor device by applying in the pattern a second laser to the semiconductor device. The method includes applying an expansion force to a tape material on a back surface of the semiconductor device to form a plurality of semiconductor devices in accordance with the pattern.

One embodiment of the disclosure is a method comprising applying a tape to a bottom surface of a semiconductor device having a top surface opposite the bottom surface. The method comprises flipping the semiconductor device, the semiconductor device having a silicon layer adjacent to the bottom surface and circuitry layer adjacent to the top surface, wherein the bottom surface of the semiconductor device is facing upwards after flipping and applying a laser through the tape, the laser having a focal point within the silicon layer. The method comprises flipping the semiconductor device again so that the top surface is facing upwards, applying a laser to the circuitry layer to cut a groove in the circuitry layer later does not penetrate the silicon layer, and applying a force to the tape to break the semiconductor device into a plurality of semiconductor devices.

FIG. 1 shows a flow chart of an embodiment of a method 100 of forming a plurality of semiconductor devices. The method 100 includes applying tape material to a back side or bottom surface of a semiconductor device, at step 110. The back side or bottom surface of the semiconductor device comprises a silicon layer and the front side or top surface of the semiconductor device comprises a circuitry layer. At step 120, the method 100 comprises lasing with an infrared laser the silicon layer of the semiconductor device through the tape material. The infrared laser may have a wavelength of 1342 nm. A focal point of the infrared laser may be focused within the silicon layer. The irradiation of the silicon layer by the infrared laser causes a portion of the silicon lattice of the silicon layer to be cleaved. As discussed herein, the infrared laser may irradiate the silicon layer through the tape in a pattern designed to cleave the silicon lattice in the same pattern. The pattern is designed to cleave the silicon lattice in order to separate the semiconductor device into a plurality of semiconductor device. In other words, the pattern follow the interfaces between individual semiconductor devices on the semiconductor device, such as a plurality of dies on a semiconductor wafer.

The method 100 includes lasing with a second laser the circuitry layer on the front side or top surface of the semiconductor device, at step 130. As discussed herein, the laser ablation by the second laser may cut a groove in the circuitry layer in the same pattern as the infrared laser is irradiated on the silicon layer. In other words, the second laser ablation may score a portion of the circuitry layer in the same pattern that the silicon lattice has been cleaved. The second laser only cuts a groove in the circuitry layer, which does not penetrate the silicon layer. The second laser may be an ultraviolet laser. The ultraviolet laser may have a wavelength of 355 nm. The method 100 includes expanding the tape material that is attached to the back side of the semiconductor device, at step 140. The expansion of the tape applies an expansion force to the semiconductor device, which cause the semiconductor device to separate into a plurality of semiconductor devices. The semiconductor devices breaks apart along the pattern, which has cleaved a portion of the silicon lattice and scored the circuitry layer along the interfaces or boundaries between the individual semiconductor devices that make up the semiconductor device.

The silicon layer of the semiconductor device may have a first thickness and the circuitry layer of the semiconductor device may a second thickness with the first thickness being greater than the second thickness. In one embodiment, the first thickness is less than five times larger than the second thickness. In one embodiment, the first thickness may be approximately 22 microns and the second thickness may be approximately 6 microns. In one embodiment, the first thickness may be less than nine times as large as the second thickness. As discussed herein, the groove or scoring in the circuitry layer by the laser ablation does not penetrate the entire thickness of the circuitry layer.

FIGS. 2A-2H are schematics that show a method of processing a semiconductor wafer 200 to form a plurality of semiconductor devices 200A, 200B, 200C (shown in FIG. 2H), such as individual dies. FIG. 2A shows a semiconductor wafer 200 having a top side or top surface 201 positioned on tape material 210. The bottom side or bottom surface 202 (shown in FIG. 2B) is attached to the tape material 210. The semiconductor wafer 200 is flipped so that the bottom surface 202 is facing upwards, as shown in FIG. 2B. The bottom surface 202 of the semiconductor wafer 200 is covered by the tape material 210. As shown in FIG. 2C, a laser 220 is irradiated through the tape material 210 into the silicon layer located on the bottom portion of the semiconductor wafer 200. The laser ablation 220 of the silicon layer is done in a grid pattern 225A to cleave the silicon lattice in order to separate the semiconductor wafer 200 into individual semiconductor devices or dies, as discussed herein.

The semiconductor wafer 200 is flipped again so that the top side or top surface 201 of the semiconductor wafer 200 is facing upwards, as shown in FIG. 2D. A coating 203 is applied to the top surface 201 of the semiconductor wafer 200 as shown in FIG. 2E. The coating 203 is applied to protect the circuitry layer from potential debris caused during the subsequent laser ablation process. The coating could be various different materials and could be applied in various different ways as would be appreciated by one of ordinary skill in the art having the benefit of this disclosure. For example, the coating may be, but is not limited to, polyvinyl alcohol spin coated onto the top side of the semiconductor device 200.

FIG. 2F is a schematic showing a laser ablation of the top surface of the semiconductor wafer 200. A second laser 230 is applied to the circuitry layer of the semiconductor wafer 200 in a grid pattern 225B that corresponds to the grid pattern 225A of the laser applied to the silicon layer done through the tape material 210 (shown in FIG. 2C). As discussed herein, the laser ablation of the circuitry layer by the second laser 230 cuts a groove into, or scores, a portion of the circuitry layer, which aids in the separation of the semiconductor wafer 200 into a plurality of semiconductor devices, as discussed herein. The groove does not penetrate the entire thickness of the circuitry layer of the semiconductor wafer 200. The coating 203 (shown in FIGS. 2E and 2F) is removed from the top surface 201 of the semiconductor wafer 200, as shown in FIG. 2G. Various methods may be used to remove the coating 203 as would be appreciated by one of ordinary skill in the art having the benefit of this disclosure. For example, the coating may be water soluble and thus, may be removed from the top surface 201 of the semiconductor wafer 200 by the application of water.

The semiconductor wafer 200 may then be formed into individual semiconductor devices 200A, 200B, 200C by the expansion of the tape material 210. A tape expanding machine may be used to expand the tape material 210 as would be appreciated by one of ordinary skill in the art having the benefit of this disclosure. The number, location, size, and/or configuration of the individual semiconductor devices or dies is shown for illustrative purposes only and may be varied depending on the application as would be appreciated by one of ordinary skill in the art having the benefit of this disclosure. For clarity, all of the individual semiconductor devices are not numbered in FIG. 2H.

Figure 3:
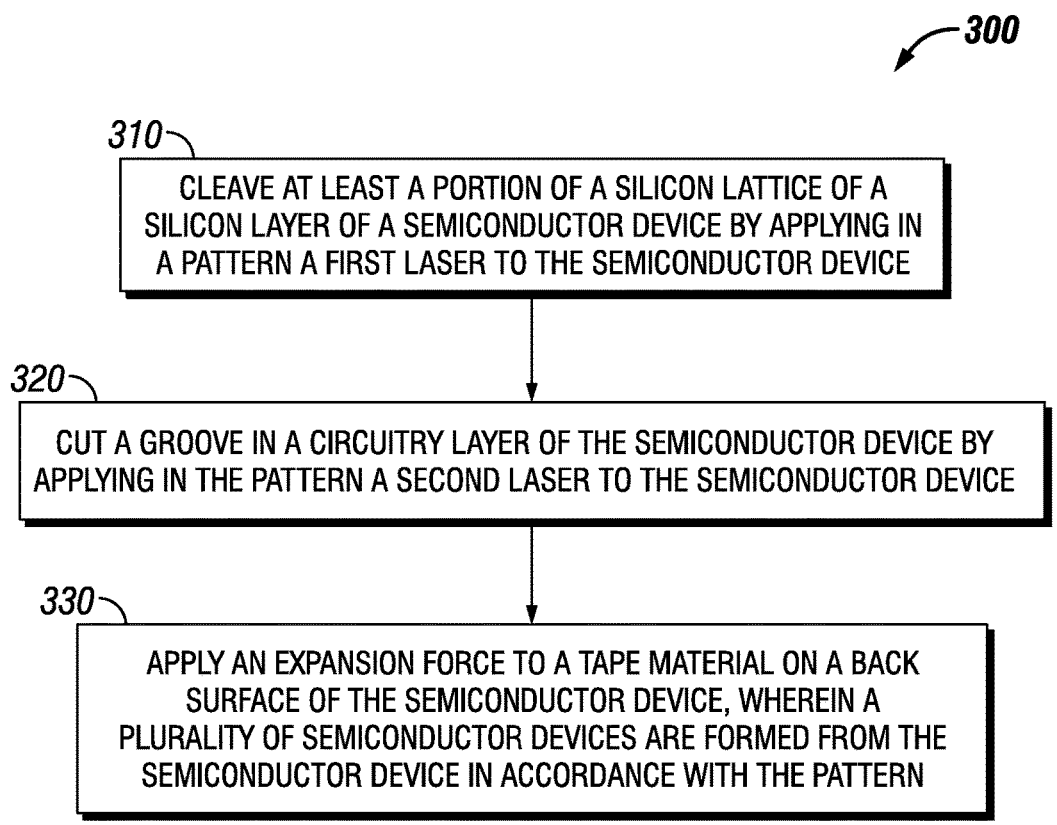
FIG. 3 is a flow chart of one embodiment of a method of forming a plurality of semiconductor devices.

FIG. 3 shows a flow chart of an embodiment of a method 300 of forming a plurality of semiconductor devices. The method 300 includes cleaving at least a portion of a silicon lattice of a silicon layer of a semiconductor device by applying in a pattern a first laser to the semiconductor device, at step 310. The first laser may be an infrared laser. A focal point of the first laser may be focused within a middle portion of the silicon layer. The irradiation of the silicon layer by the infrared laser causes a portion of the silicon lattice of the silicon layer to be cleaved. As discussed herein, the first laser may irradiate the silicon layer through tape on the back of the semiconductor device and the first laser may be irradiated in a pattern designed to cleave the silicon lattice in the same pattern. The pattern is designed to cleave the silicon lattice in order to separate the semiconductor device into a plurality of semiconductor device. In other words, the pattern follow the interfaces between individual semiconductor devices on the semiconductor device, such as a plurality of dies on a semiconductor wafer.

At step 320, the method 300 comprises cutting a groove in a circuitry layer of the semiconductor device by applying in the pattern a second laser to the semiconductor device. The circuitry layer may have a first thickness and the groove may have a second thickness that is less than the first thickness. As discussed herein, the laser ablation by the second laser may cut a groove in the circuitry layer in the same pattern as the first laser is irradiated on the silicon layer. In other words, the second laser ablation may score a portion of the circuitry layer in the same pattern that the silicon lattice has been cleaved. The second laser may be an ultraviolet laser.

The method 300 includes applying an expansion force to a tape material on a back surface of the semiconductor device, wherein a plurality of semiconductor devices, such as dies, are formed from the semiconductor device in accordance with the pattern, at step 330. The expansion of the tape applies an expansion force to the semiconductor device, which cause the semiconductor device to separate into a plurality of semiconductor devices along the pattern. In other words, the semiconductor device breaks apart along the pattern at which a portion of the silicon lattice has been cleaved and the circuitry layer has been scored.

Figure 4:
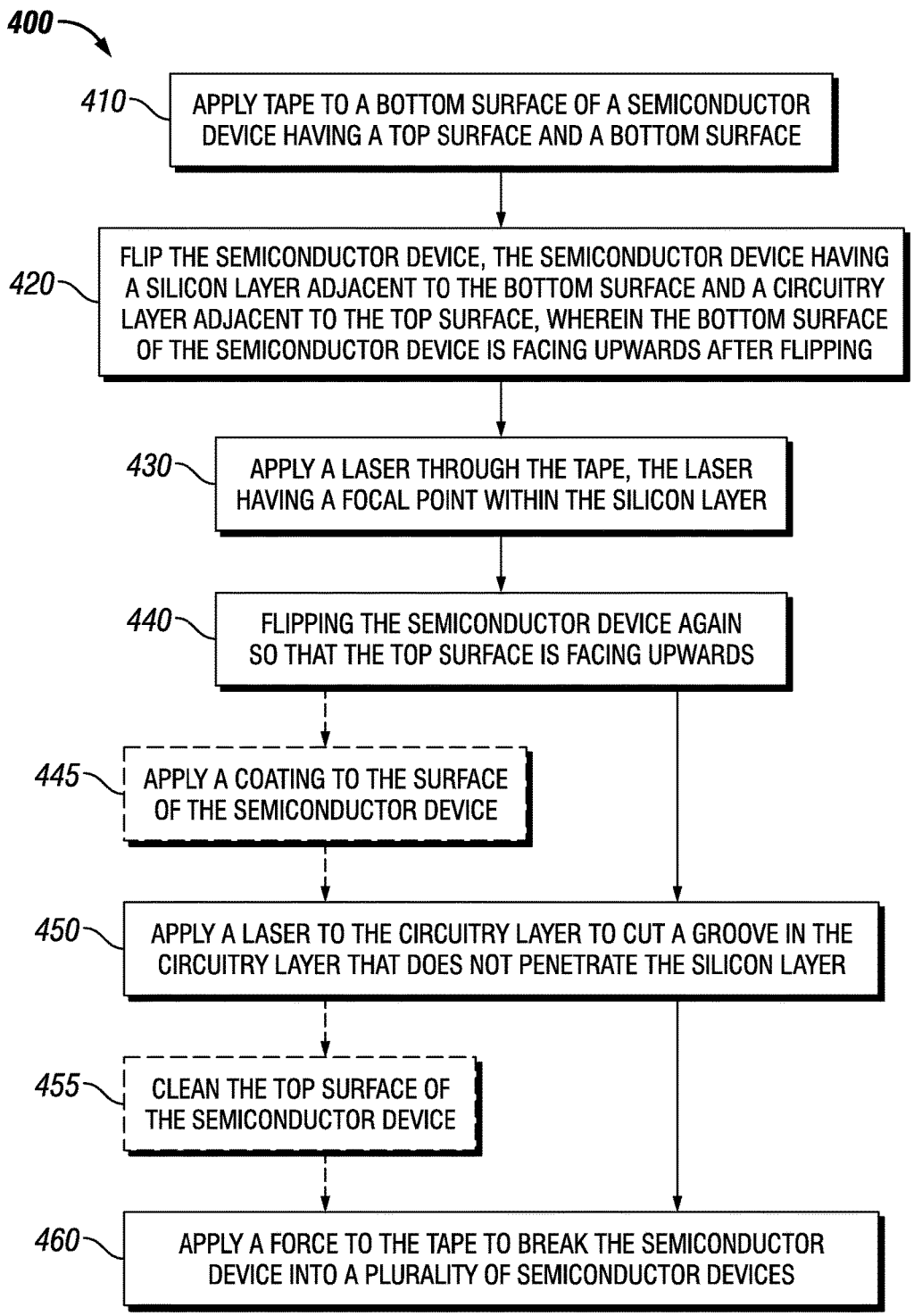
FIG. 4 is a flow chart of one embodiment of a method of forming a plurality of semiconductor devices.

FIG. 4 shows a flow chart of an embodiment of a method 400 of forming a plurality of semiconductor devices. The method 400 includes applying tape to a bottom surface of a semiconductor device having a top surface and a bottom surface, at step 410. The method 400 includes flipping the semiconductor device, the semiconductor device having a silicon layer adjacent to the bottom surface and a circuitry layer adjacent to the top surface, wherein the bottom surface of the semiconductor device is facing upwards after flipping, at step 420. In step 430, a laser is applied through the tape, the laser having a focal point within the silicon layer. As discussed above, the laser cleaves a portion of the silicon lattice of the silicon laser. The method 400 includes flipping the semiconductor device again so that the top surface is facing upwards, at step 440.

The method 400 may include the optional step of applying a coating to the top surface of the semiconductor device, at step 445. The coating is to protect the circuitry layer of the semiconductor device from potential debris created during subsequent laser ablation of the circuitry layer. The coating could be polyvinyl alcohol that is applied via spin coating. The method 400 includes applying a laser to the circuitry layer to cut a groove in the circuitry layer that does not penetrate the silicon layer, at step 450. The method 400 may include the optional step of cleaning the top surface of the semiconductor device, at step 445. For example, the coating may be removed from the top surface. The method 400 includes applying a force to the tape to break the semiconductor device into a plurality of semiconductor devices, at step 460. For example, a tape expander machine may be used to expand the tape attached to the back side or bottom surface of the semiconductor device cause the semiconductor device to break apart along the grooves in the circuitry layer and cleaved lattices in the silicon layer.

Figure 5:
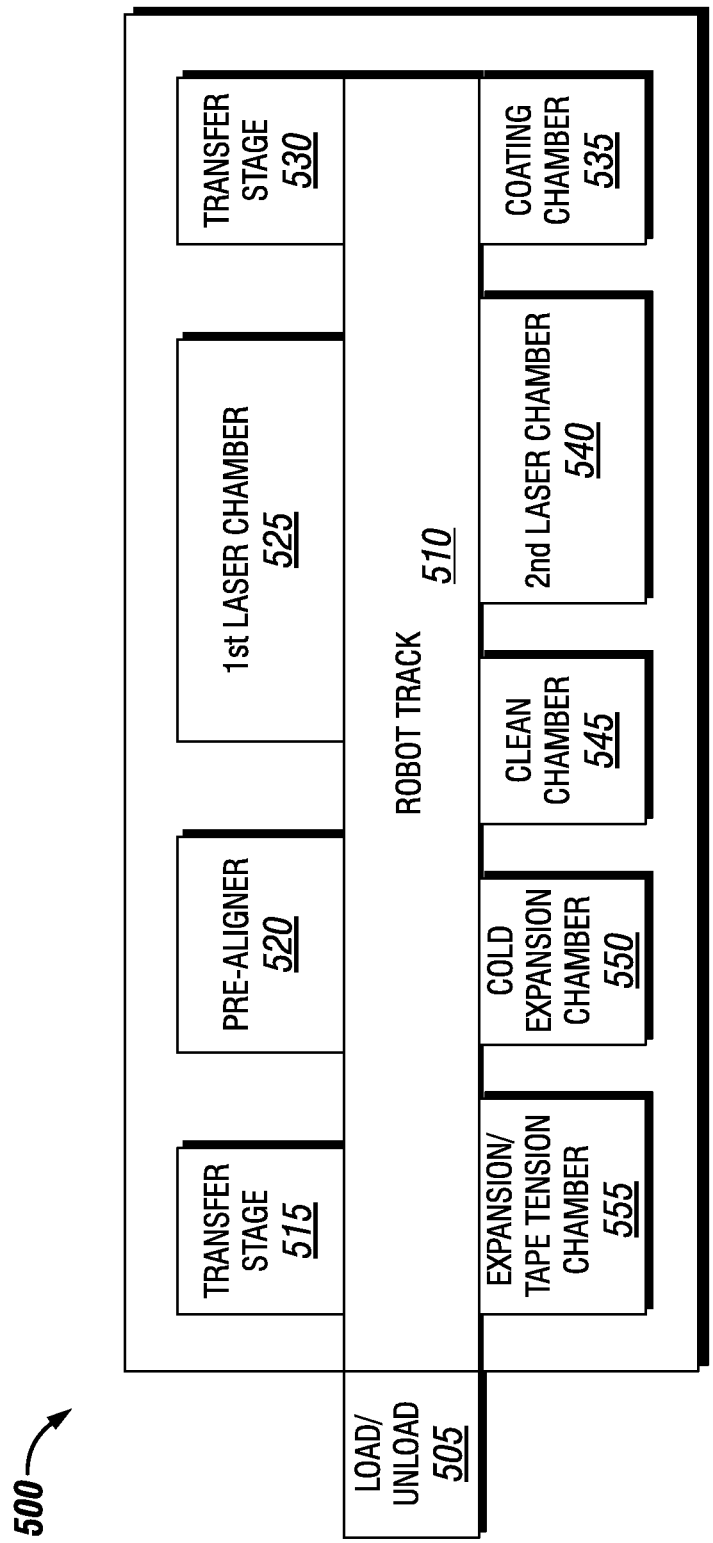
FIG. 5 is a schematic of an embodiment of an apparatus for forming a plurality of semiconductor devices.

FIG. 5 shows an embodiment of an apparatus 500 that may be used to form a plurality of semiconductor devices. The apparatus 500 includes port 505 at which a semiconductor device may be loaded into the apparatus 500 and a plurality of semiconductor devices may be removed from the apparatus 500. The apparatus 500 includes a semiconductor device handling system that may be used to manipulate, including, but not limited to, moving, lifting, rotating, flipping, raising, and/or lowering a semiconductor device between various stages within the apparatus 500. For example, the semiconductor device handling system may be a robot track 510, which may be used to move a semiconductor device(s) between various stages within the apparatus 500. The robot track 510 may be used to flip, rotate, lift, and/or lower a semiconductor device for processing within the apparatus 500 as would be appreciated by one of ordinary skill in the art having the benefit of this disclosure.

The apparatus 500 may include a plurality of transfer stages 515, 530 that the robot track 510 may use to manipulate a semiconductor device while being processed within the apparatus 500. For example, a semiconductor device may be placed on a transfer stage 515, 530 permitting the robot track 510 to obtain a different grip on the semiconductor device. A semiconductor device, such as a wafer, that has tape material applied to the back or bottom surface of the semiconductor device is loaded into the apparatus 500 at the load/unload port 505. The robot track 510 is used to transfer the semiconductor device to the per-aligner stage 520 with the back or bottom surface of the semiconductor device facing upwards. The robot track 510 may use the transfer stage 515 to flip the semiconductor device so that the back or bottom surface of the semiconductor device is facing upwards. The pre-aligner stage 520 aligns the semiconductor device so that it will be properly lased in the first laser chamber 525.

Once the semiconductor device has been properly aligned in the pre-aligner stage 520, the robot track 510 moves the semiconductor device to the first laser chamber 525. As discussed herein, the first laser may be an infrared laser and the silicon lattice of the semiconductor device may be cleaved in a desired pattern by the infrared laser in the first laser chamber 525. After finishing the cleaving process by the first laser, the robot track 510 moves the semiconductor device to the coating chamber 535. The robot track 510 may use transfer stage 530 to flip the semiconductor device again so that top or front surface of the semiconductor device is facing upwards. A coating is applied to the semiconductor device in coating chamber 535. As discussed herein, the coating may protect the semiconductor device from debris potential generated by the laser ablation with a second laser, which may be an ultraviolet laser.

The robot track 510 moves the semiconductor device to the second laser chamber 540 after a coating has been applied in the coating chamber 535. In the second laser chamber 540, a second laser ablates a circuitry layer on the semiconductor in the same pattern as lased with the first laser to the silicon portion of the semiconductor device, as discussed herein. The second laser may be an ultraviolet laser. The robot track 510 then moves the semiconductor device to the clean chamber 545 to remove the coating from the semiconductor device. After the removal of the coating, the robot track 510 moves the semiconductor device to the cold expansion chamber 550, which rapidly cools and expands the tape material. The cold expansion chamber 550 may make the tape material brittle. The robot track 510 then moves the semiconductor device to the expansion/tape tension chamber, which expands and holds the tape causing the semiconductor device to separate into a plurality of semiconductor devices in accordance with the pattern lased by both the first and second lasers.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A method of forming a plurality of semiconductor devices comprising:
    cleaving at least a portion of a silicon lattice of a silicon layer of a semiconductor device by applying in a pattern a first laser to the semiconductor device;
    cutting a groove in a circuitry layer of the semiconductor device by applying in the pattern a second laser to the semiconductor device; and
    applying an expansion force to a tape material on a back surface of the semiconductor device, wherein a plurality of semiconductor devices are formed from the semiconductor device in accordance with the pattern, wherein the circuitry layer has a first thickness and the groove in circuitry layer has a second thickness that is less than the first thickness.

2. The method of claim 1, further comprising:
    wherein the first laser is applied through the tape on the back surface of the semiconductor and wherein the second laser is applied after the first laser.

3. The method of claim 2, wherein the first laser has a focal point substantially in a middle portion of the silicon layer.

* * * * *